(12) United States Patent
Chern

(10) Patent No.: US 11,217,744 B2
(45) Date of Patent: Jan. 4, 2022

(54) MAGNETIC MEMORY DEVICE WITH MULTIPLE SIDEWALL SPACERS COVERING SIDEWALL OF MTJ ELEMENT AND METHOD FOR MANUFACTURING THE SAME

(71) Applicant: HeFeChip Corporation Limited, Sai Ying Pun (HK)

(72) Inventor: Geeng-Chuan Chern, Cupertino, CA (US)

(73) Assignee: HeFeChip Corporation Limited, Sai Ying Pun (HK)

( * ) Notice: Subject to any disclaimer, the term of this patent is extended or adjusted under 35 U.S.C. 154(b) by 103 days.

(21) Appl. No.: 16/709,867

(22) Filed: Dec. 10, 2019

(65) Prior Publication Data

US 2021/0175412 A1 Jun. 10, 2021

(51) Int. Cl.
| H01L 43/02 | (2006.01) |
| G11C 11/16 | (2006.01) |
| H01L 43/12 | (2006.01) |
| H01L 43/08 | (2006.01) |
| H01L 43/10 | (2006.01) |
| H01L 27/22 | (2006.01) |

(52) U.S. Cl.
CPC ............ *H01L 43/02* (2013.01); *G11C 11/161* (2013.01); *H01L 27/226* (2013.01); *H01L 43/08* (2013.01); *H01L 43/10* (2013.01); *H01L 43/12* (2013.01)

(58) Field of Classification Search
CPC ....... H01L 43/02; H01L 27/226; H01L 43/08; H01L 43/10; H01L 43/12; G11C 11/161

USPC ......................................................... 257/421
See application file for complete search history.

(56) References Cited

U.S. PATENT DOCUMENTS

| 6,048,775 | A | 4/2000 | Yao | |
|---|---|---|---|---|
| 6,808,748 | B2 | 10/2004 | Kapoor | |
| 7,223,701 | B2 | 5/2007 | Min | |
| 7,936,027 | B2 * | 5/2011 | Xiao | H01L 43/12 |
| | | | | 257/421 |
| 8,456,893 | B2 | 6/2013 | Horng | |
| 8,536,063 | B2 | 9/2013 | Satoh | |
| 9,412,935 | B1 * | 8/2016 | Lin | H01L 43/08 |
| 9,806,252 | B2 * | 10/2017 | Tan | C23F 1/12 |
| 2006/0171083 | A1 * | 8/2006 | Lee | G01R 33/093 |
| | | | | 360/324.2 |
| 2013/0015541 | A1 * | 1/2013 | Kanaya | H01L 43/12 |
| | | | | 257/421 |
| 2016/0190432 | A1 * | 6/2016 | Shum | H01L 27/222 |
| | | | | 257/427 |
| 2017/0040531 | A1 * | 2/2017 | Chung | H01L 21/266 |

(Continued)

*Primary Examiner* — Jami Valentine Miller
(74) *Attorney, Agent, or Firm* — Winston Hsu

(57) ABSTRACT

A magnetic memory device includes an MTJ element between a bottom electrode layer and a top electrode layer. The MTJ element comprises a reference layer, a tunnel barrier layer and a free layer. The reference layer comprises sub-layers that protrude beyond a sidewall of the tunnel barrier layer. The tunnel barrier layer protrudes beyond a sidewall of one of sub-layers of the free layer. Sidewall spacers are disposed to respectively cover a sidewall of the top electrode layer, sidewalls of the sub-layers of the free layer, a sidewall of the tunnel barrier layer, and sidewalls of the sub-layers of the reference layer. The etching of the MTJ stack and the formation of the sidewall spacers are carried out in the same HDPCVD chamber without breaking the vacuum.

23 Claims, 12 Drawing Sheets

(56) References Cited

U.S. PATENT DOCUMENTS

2017/0084828 A1* 3/2017 Hsu .................. H01L 43/12
2017/0117027 A1* 4/2017 Braganca ............ H01L 43/02
2017/0125663 A1* 5/2017 Nagel ................ H01L 43/12
2018/0182809 A1* 6/2018 Liu .................. H01L 43/12

* cited by examiner

MAGNETIC MEMORY DEVICE WITH MULTIPLE SIDEWALL SPACERS COVERING SIDEWALL OF MTJ ELEMENT AND METHOD FOR MANUFACTURING THE SAME

BACKGROUND OF THE INVENTION

1. Field of the Invention

The present disclosure relates to a magnetic memory device, and more particularly, to a magnetic tunnel junction (MTJ) element with sidewall protection for magnetic memory devices, and a method for manufacturing the same.

2. Description of the Prior Art

Magnetoresistive random access memory (MRAM), based on the integration of silicon CMOS with MTJ technology, is a major emerging technology that is highly competitive with existing semiconductor memories such as SRAM, DRAM, Flash, etc., and has the potential of becoming universal memories. Spin Transfer Torque (STT) MRAM is especially popular due to its smaller cell size.

The MTJ stack of STT MRAM usually contains about 20-30 layers of different materials with thickness ranging from a few tenths of nm to a few nm. It is very difficult to pattern these materials by the conventional plasma etch chemistries because of the non-volatile by-products. Thus, the non-reactive Ion Beam Etch (IBE) methods utilizing inert gas ions, such as argon (Ar) ions, are typically implemented to sputter off the materials in the unwanted areas.

However, the IBE methods suffer from leakage or short issues due to re-deposition of the sputtered off materials on the MTJ sidewalls. Some prior arts have added organic chemicals, such as CO, $CH_3OH$, etc. to argon (Ar) plasma so that the etched by-products become organometallic complexes, which are relatively more volatile and can be pumped out of the etching chamber. However, this approach tends to slow down the etch rate, and the residual organometallic complexes might have impact on the MTJ long term reliability.

Some other methods, using several different machines, include the following steps:
1. Partially etch the MTJ stack, mostly up to the layer on top of the tunneling dielectric layer, e.g. MgO.
2. Deposit an insulator layer.
3. Anisotropic etch the insulator layer to form sidewall protection.
4. Deliver the wafer back to the IBE tool for further etch.

However, the above-mentioned prior art is complex and requires different machines or tools and cannot prevent leakage or short between each 2 adjacent sub-layers. While leakage or short between 2 adjacent sub-layers might not be fatal, it does degrade MTJ performance and could increase write and/or read error rates. Some prior arts involve combination of Atomic Layer Deposition (ALD) and Atomic Layer Etch (ALE) together with sidewall protection. All these, require multiple machines, and might require development of new machines, which are time-consuming and expensive processes.

SUMMARY OF THE INVENTION

It is one object of the present disclosure to provide an improved magnetic tunnel junction (MTJ) element with sidewall protection on each sub-layer for a magnetic memory device, which is capable of solving the above-mentioned prior art shortcomings or problems.

One aspect of the present disclosure provides a magnetic memory device including a substrate and at least a memory stack on the substrate. The memory stack includes a magnetic tunneling junction (MTJ) element sandwiched between a bottom electrode layer and a top electrode layer. The MTJ element comprises a reference layer disposed on the bottom electrode layer, a tunnel barrier layer disposed on the reference layer, and a free layer disposed on the tunnel barrier layer. The reference layer comprises a plurality of sub-layers and the free layer comprises a plurality of sub-layers.

A sidewall protection layer is provided to protect the sidewalls of the layers/sub-layers of the MTJ element during fabrication of the memory stack. The sidewall protection layer comprises a plurality of sidewall spacers respectively covering a sidewall of the top electrode layer, sidewalls of the plurality of sub-layers of the free layer, a sidewall of the tunnel barrier layer, and at least one of sidewalls of the plurality of sub-layers of the reference layer.

At least one of the plurality of sub-layers of the reference layer protrudes beyond a sidewall of the tunnel barrier layer. The tunnel barrier layer protrudes beyond a sidewall of at least one of the plurality of sub-layers of the free layer.

The sidewall protection layer comprises at least a first sidewall spacer covering the sidewall of the at least one of the plurality of sub-layers of the free layer, at least a second sidewall spacer covering the first sidewall spacer and the sidewall of the tunnel barrier layer, and at least a third sidewall spacer covering the second sidewall spacer and the at least one of sidewalls of the at least one of the plurality of sub-layers of the reference layer.

According to some embodiments, the at least one of the plurality of sub-layers of the reference layer has a width greater than that of the tunnel barrier layer, and the tunnel barrier layer a width greater than that of the at least one of the plurality of sub-layers of the free layer, thereby forming a ladder-shaped sidewall profile of the MTJ element.

According to some embodiments, the first sidewall spacer, the second sidewall spacer, and the third sidewall spacer are silicon nitride spacers.

According to some embodiments, each of the first sidewall spacer, the second sidewall spacer, and the third sidewall space has a thickness of about 3-10 nm.

According to some embodiments, the plurality of sub-layers of the reference layer comprise a bottom pinned layer, a ruthenium metal layer, a top pinned layer, a tantalum metal layer, and a magnetic material layer.

According to some embodiments, the reference layer comprises a magnetic material comprising CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combinations thereof.

According to some embodiments, the reference layer comprises a magnetic structure comprising repeated alternating layers of two or more material.

According to some embodiments, the reference layer comprises a magnetic material comprising CoCr, CoCrB, CoCrPt, CoCrPtB, CoCrPd, CoCrTi, CoCrZr, CoCrHf, CoCrV, CoCrNb, CoCrTa, or any combinations thereof.

According to some embodiments, the reference layer may comprise a super lattice structure.

According to some embodiments, the tunnel barrier layer comprises MgO, $Al_2O_3$, MgAlO, MgZnO, HfO, or any combinations thereof.

According to some embodiments, the free layer comprises Fe, Co, B, Ni, or any combinations thereof.

According to some embodiments, the free layer comprises CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combinations thereof.

According to some embodiments, the MTJ element further comprises a capping layer interposed between the top electrode layer and the free layer.

According to some embodiments, the capping layer comprises MgO or $Al_2O_3$.

According to some embodiments, the top electrode layer comprises a ruthenium (Ru) layer or a tantalum (Ta) layer.

According to some embodiments, the top electrode layer further comprises a titanium nitride (TiN) layer or a tantalum nitride (TaN) layer.

According to some embodiments, the top electrode is electrically connected to a bit line overlying the MTJ element.

According to some embodiments, the bottom electrode layer comprises NiCr, Ru, Pt, Cu, Ta, TaN, Ti, TiN, or any combinations thereof.

According to some embodiments, the bottom electrode layer is electrically coupled to a drain doping region of an access transistor disposed on the substrate.

According to some embodiments, the substrate comprises a silicon substrate or a silicon-on-insulator (SOT) substrate.

According to some embodiments, the magnetic memory device further comprises a high-density plasma chemical vapor deposition (HDPCVD) oxide layer covering the plurality of sidewall spacers and filling gaps in between MTJs.

Another aspect of the present invention provides a method for forming a magnetic memory device. A substrate is provided.

At least a magnetic tunneling junction (MTJ) stack is formed on the substrate and then the MTJ stack is etched and passivated, alternately, in a high-density plasma chemical vapor deposition (HDPCVD) chamber to pattern said MTJ stack into MTJ elements. Each of the MTJ elements comprises a reference layer, a tunnel barrier layer, and a free layer. The reference layer comprises at least one sub-layer that protrudes beyond a sidewall of the tunnel barrier layer. The tunnel barrier layer protrudes beyond a sidewall of the free layer.

An in-situ sidewall protection layer is formed when etching the MTJ stack, comprising: forming at least a first sidewall spacer on the sidewall of the free layer; forming at least a second sidewall spacer on the first sidewall spacer and the sidewall of the tunnel barrier layer; and forming at least a third sidewall spacer on the second sidewall spacer and at least a sidewall of the at least one sub-layer of the reference layer. The etching of the MTJ stack and formation of the in-situ sidewall protection layer are carried out in the HDPCVD chamber without breaking vacuum thereof.

According to some embodiments, the etching of the MTJ stack and formation of the in-situ sidewall protection layer are carried out in the HDPCVD chamber by switching between an etch mode and a deposition mode.

According to some embodiments, the method further comprising: forming a top electrode layer on the MTJ stack.

According to some embodiments, the top electrode layer comprises a ruthenium (Ru) layer or a tantalum (Ta) layer.

According to some embodiments, the top electrode layer further comprises a titanium nitride (TiN) layer or a tantalum nitride (TaN) layer.

According to some embodiments, the first sidewall spacer, the second sidewall spacer, and the third sidewall spacer are silicon nitride spacers.

According to some embodiments, each of the first sidewall spacer, the second sidewall spacer, and the third sidewall space has a thickness of about 3-10 nm.

According to some embodiments, the reference layer comprises a bottom pinned layer, a ruthenium metal layer, a top pinned layer, a tantalum metal layer, and a magnetic material layer.

According to some embodiments, the method further comprises: performing a gap-fill deposition process in the HDPCVD chamber to deposit an HDPCVD dielectric layer on the MTJ elements and into space between the MTJ elements.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
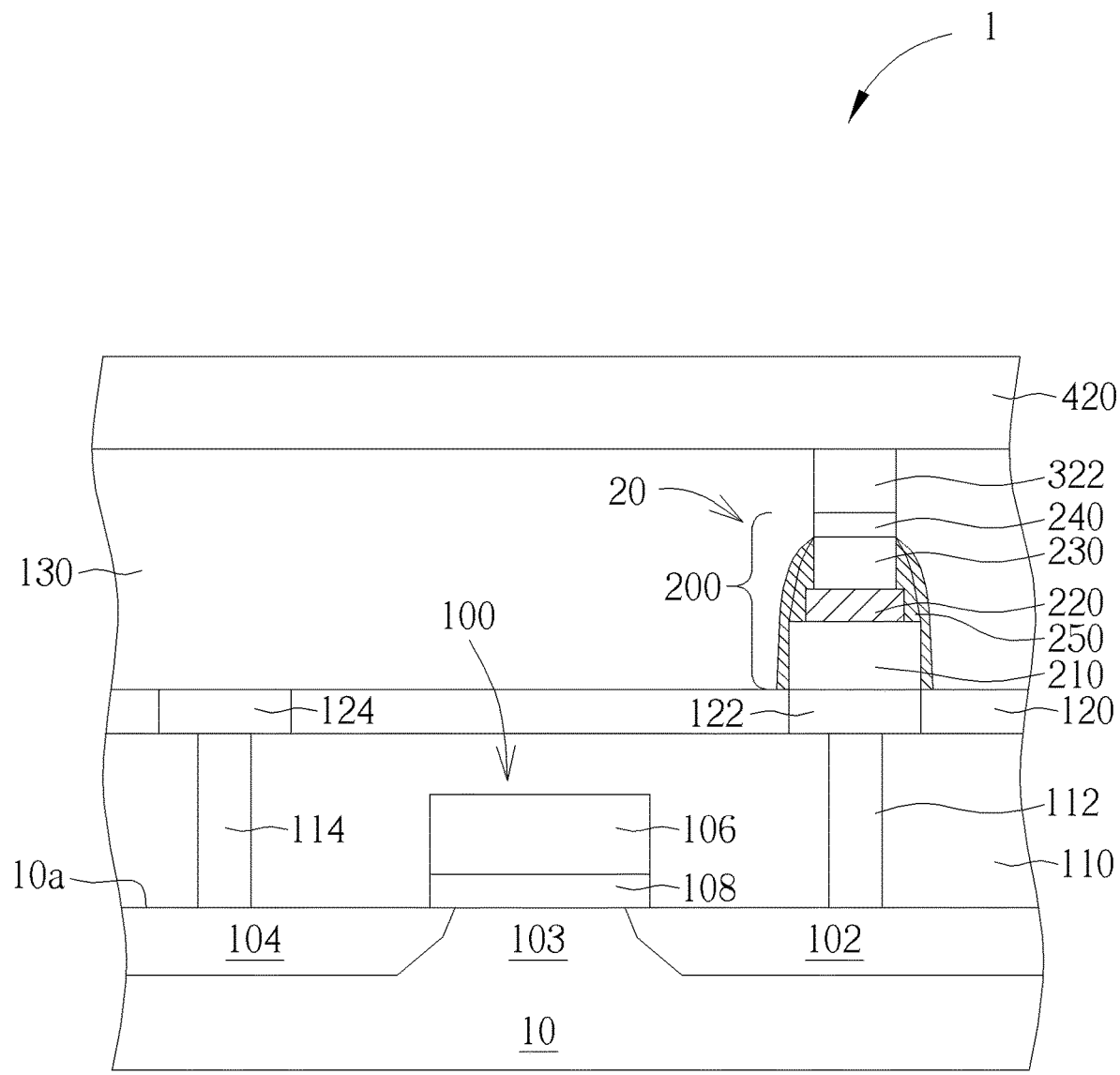
FIG. 1 is a schematic, cross-sectional diagram showing an exemplary one-transistor-one-MTJ (1T1MTJ) structure of a MRAM device according to a non-limiting embodiment of the present invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The present disclosure pertains to an improved magnetic tunneling junction (MTJ) element of a magnetoresistive random access memory (MRAM) device such as a spin-transfer torque magnetoresistive random access memory (STT-MRAM) device. STT-MRAM is a non-volatile memory, which has several advantages over the conventional magnetoresistive random access memory. For example, these advantages include higher scalability, lower-power consumption, and faster operating speed. Spin transfer torque is an effect in which the magnetization orientation of a magnetic layer in a magnetic tunnel junction or spin valve can be modified using a spin-polarized current. STT-MRAM uses electrons that become spin-polarized as the electrons pass through a thin film (spin filter). During a write operation, the spin-polarized electrons exert torque on a free layer, which switches a polarity of the free layer. During a read operation, a current detects the resistance/logic state of the MTJ storage element.

A MRAM device is generally comprised of an array of parallel first conductive lines such as word lines on a horizontal plane, an array of parallel second conductive lines such as bit lines on a second horizontal plane spaced above and formed in a direction perpendicular to the first conductive lines, and a MTJ element interposed between a first conductive line and a second conductive line at each crossover location. Typically, access transistors may be disposed below the array of first conductive lines to select certain MRAM cells within the MRAM array for read or write operations.

A MTJ element may be based on a tunnel magnetoresistance (TMR) effect wherein a stack of layers has a configuration in which two ferromagnetic layers are separated by a thin non-magnetic dielectric layer or tunnel barrier layer. If the tunnel barrier layer is thin enough, electrons can tunnel from one ferromagnet into the other. In a MRAM device, the MTJ element is typically formed between a bottom electrode layer and a top electrode layer. A MTJ stack of layers that is subsequently patterned to form a MTJ element may be formed by sequentially depositing a seed layer, an anti-ferromagnetic (AFM) pinning layer, a ferromagnetic "pinned" layer, a thin tunnel barrier layer, a ferromagnetic "free" layer, and a capping layer. The AFM layer holds the magnetic moment of the pinned layer in a fixed direction.

FIG. 1 is a schematic, cross-sectional diagram showing an exemplary one-transistor-one-MTJ (1T1MTJ) structure of a MRAM device 1 according to a non-limiting embodiment of the present invention. As shown in FIG. 1, the MRAM device 1 comprises a substrate 10 having a top surface 10a. For example, the substrate 10 may be a silicon substrate, a silicon-on-insulator (SOI) substrate, or any suitable semiconductor substrates known in the art.

According to one embodiment, an access transistor 100 may be formed on the top surface 10a of the substrate 10. The access transistor 100 may comprise a drain doping region 102 and a source doping region 104 spaced apart from the drain doping region 104. The drain doping region 102 and the source doping region 104 may be formed by ion implantation process and may be formed in the substrate 10. A channel region 103 may be formed between the drain doping region 102 and the source doping region 104. A gate 106 may be formed over the channel region 103. A gate dielectric layer 108 such as a silicon oxide layer may be formed between the gate 106 and the channel region 103.

It is to be understood that the MRAM device 1 may comprise peripheral circuits for supporting the MRAM memory array. The peripheral circuits may be formed in a logic circuit area, which is not shown for the sake of simplicity.

An inter-layer dielectric (ILD) layer 110 such as an oxide layer or an ultra-low k (ULK) dielectric layer may be deposited over the substrate 10. The ILD layer 110 covers the gate 106, the drain doping region 102, and the source doping region 104 of the transistor 100. A contact plug 112 and a contact plug 114 may be formed directly on the drain doping region 102 and the source doping region 104, respectively, in the ILD layer 110. For example, the contact plug 112 and the contact plug 114 may comprise Cu, Ti, TiN, Ta, TaN, W, alloys or combinations thereof, but is not limited thereto. An ILD layer 120 and an ILD layer 130 may be deposited over the ILD layer 110. For example, the ILD layer 120 may comprise an oxide layer or an ULK dielectric layer, but not limited thereto. For example, the ILD layer 130 may comprise an oxide layer such as a high-density plasma (HDP) CVD oxide layer, but not limited thereto.

According to one embodiment, a memory stack 20 may be formed on the contact plug 112 in the ILD layer 130. The memory stack 20 may comprise a magnetic tunneling junction (MTJ) element 200 sandwiched between a bottom electrode layer 122 and a top electrode layer 322. The bottom electrode layer 122 may be disposed in the ILD layer 120. The MTJ element 200 is electrically coupled to the drain doping region 102 through the bottom electrode layer 122 and the contact plug 112. For example, the bottom electrode layer 122 may comprise NiCr, Ru, Pt, Cu, Ta, TaN, Ti, TiN, or any combinations thereof.

According to one embodiment, the MTJ element 200 may comprise layered structure generally including, but not limited to, a reference layer (or pinned layer) 210, a tunnel barrier layer 220 stacked directly on the reference layer 210, and a free layer 230 stacked directly on the tunnel barrier layer 220. According to one embodiment, the reference layer 210 may comprise a pinned layer, an anti-ferromagnetic (AFM) layer, and/or a polarization enhancement layer (PEL), but not limited thereto.

For example, the reference layer 210 may be formed of a magnetic material comprising Co and Fe, including but not limited to CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combinations thereof. Moreover, the reference layer 210 may also have a magnetic structure comprising repeated alternating layers of two or more materials, such as but not limited to $(Co/Pt)_n$, $(Co/Pd)_n$, $(Co/Ni)_n$, $(CoFe/Pt)_n$, $(Co/Pt(Pd))_n$, or any combinations thereof. Alternatively, the reference layer 210 may be formed of a magnetic material comprising Co and Cr, including but not limited to CoCr, CoCrB, CoCrPt, CoCrPtB, CoCrPd, CoCrTi, CoCrZr, CoCrHf, CoCrV, CoCrNb, CoCrTa, or any combinations thereof. For example, the reference layer 210 may comprise a super lattice structure.

According to one embodiment, the tunnel barrier layer 220 may comprise an insulator, including but not limited to MgO, $Al_2O_3$, MgAlO, MgZnO, HfO, or any combinations thereof. According to one embodiment, the tunnel barrier layer 220 may have a thickness of about 0.5 nm-3.0 nm.

Figure 12:
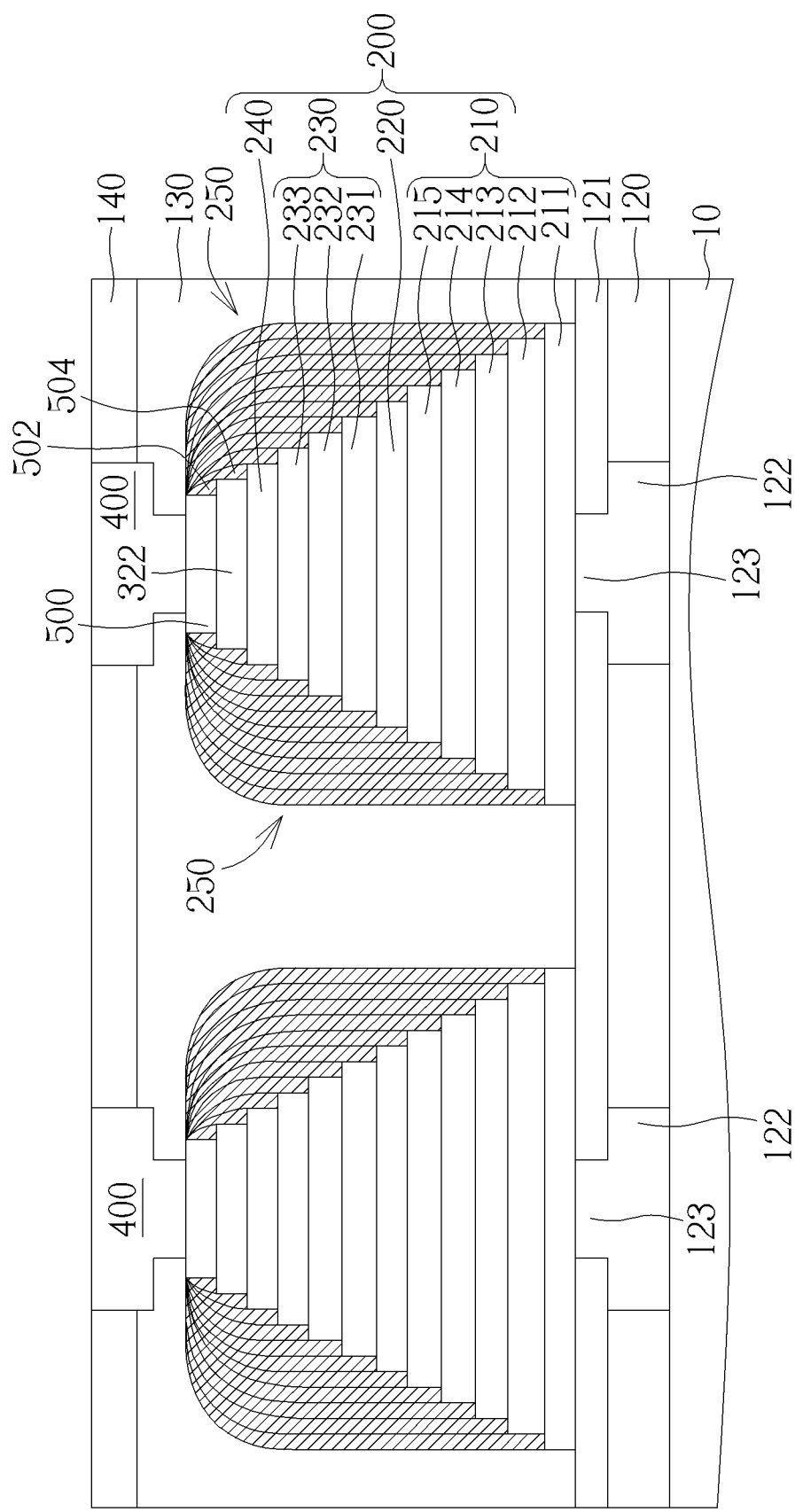
FIG. 12 is a schematic, cross-sectional diagram showing a MRAM device according to another embodiment of the present invention.

According to one embodiment, the free layer 230 may comprise ferromagnetic materials. For example, the free layer 230 may be a single layer or multi-layer structure. For example, the free layer 230 may comprise Fe, Co, B, Ni, or any combinations thereof. For example, the free layer 230 may be formed of a magnetic material including but not limited to CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combinations thereof. For example, the free layer 230 may comprise a super lattice structure. According to one embodiment, as shown in FIG. 12, for example, the free layer 230 may comprise sub-layers 231~233.

According to one embodiment, the MTJ element 200 may further comprise a capping layer 240, such as MgO or $Al_2O_3$, interposed between the top electrode layer 322 and the free layer 230. According to one embodiment, the top electrode layer 322 may comprise a ruthenium (Ru) layer and/or a tantalum (Ta) layer. For example, the top electrode layer 322 may be composed of ruthenium (Ru) having a hexagonal close packed (hcp) crystalline structure. The top electrode layer 322 may act as an etching stopper, for example, during the etching process for patterning the MTJ element 200. According to one embodiment, the top electrode layer 322 may further comprise a titanium nitride (TiN) layer or a tantalum nitride (TaN) layer on top of the Ru layer. The MTJ element 200 is electrically connected to an overlying bit line 420 through the top electrode layer 322.

According to one embodiment, the MTJ element 200 is provided with an in-situ sidewall protection layer 250 covering each sidewall surface of each layer or sub-layer of the MTJ element 200, respectively. According to one embodiment, the in-situ sidewall protection layer 250 may comprise silicon nitride or silicon oxide, but not limited thereto. For example, the sidewall protection layer 250 may preferably comprise silicon nitride to avoid the adverse effects of the oxygen atoms. According to one embodiment, the in-situ sidewall protection layer 250 may be composed of a plurality of sidewall spacers disposed on respective sidewall surfaces of the layers/sub-layers of the MTJ element 200 and on respective protruding portions of the underlying layers/sub-layers. The in-situ sidewall protection layer 250 protects the layers/sub-layers of the MTJ element 200 from leakage or short risk.

Figure 2:
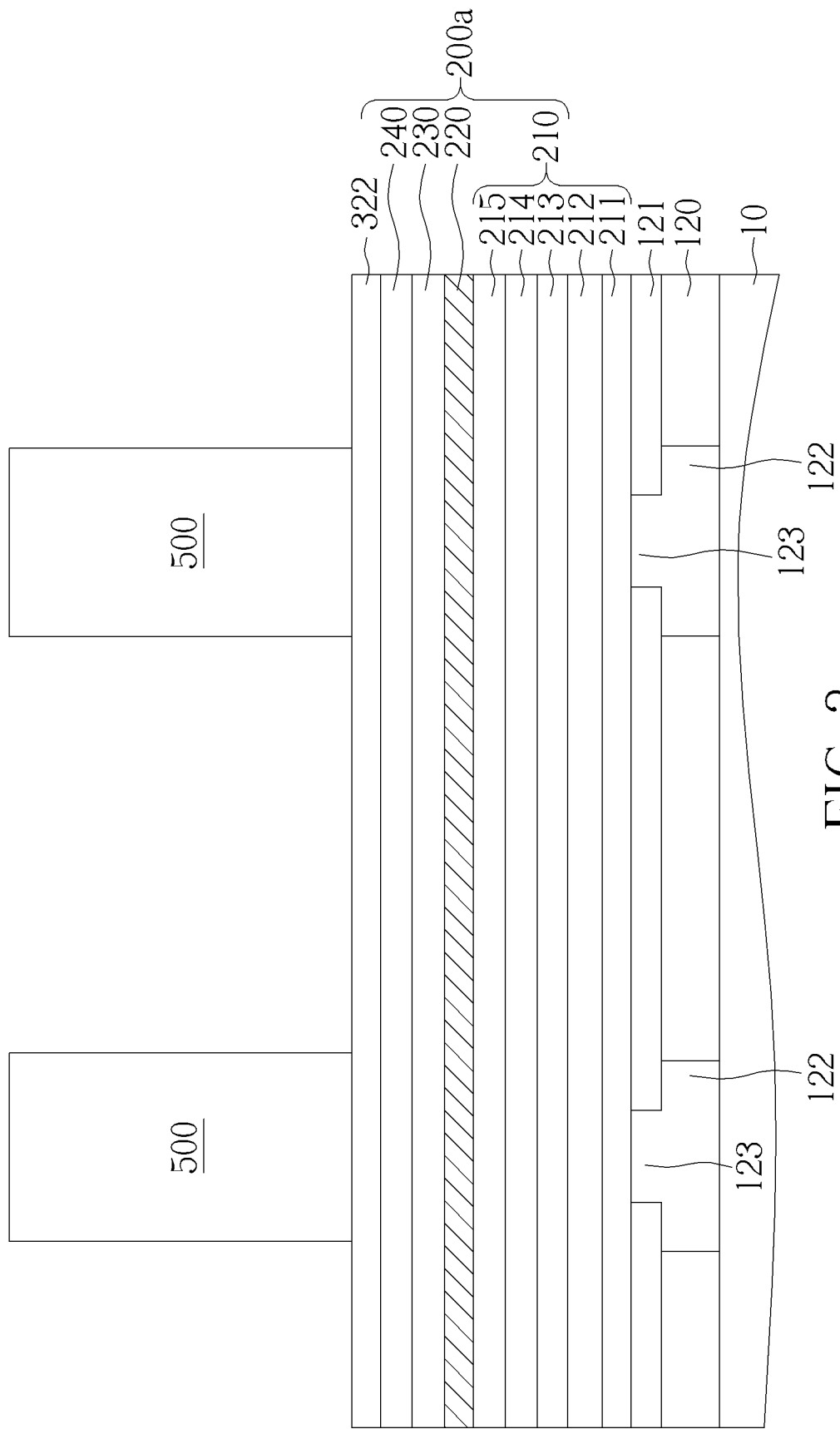
FIG. 2 to FIG. 11 are cross-sectional diagrams showing a method for fabricating a MTJ element of a magnetic memory device according to one embodiment of the present disclosure.

Please refer to FIG. 2 to FIG. 11. FIG. 2 to FIG. 11 are cross-sectional diagrams showing a method for fabricating a MTJ element of a magnetic memory device according to one embodiment of the present disclosure, wherein like elements, regions, or layers are designated by like numeral numbers. As shown in FIG. 2, a substrate 10 is provided. For example, the substrate 10 may be a silicon substrate, a SOI substrate, or any suitable semiconductor substrates known in the art. For the sake of simplicity, only the germane region for forming the MTJ element is shown in FIG. 2 to FIG. 11. It is understood that peripheral circuits for supporting the MRAM memory array may be formed on the substrate 10. The peripheral circuits may be formed in a logic circuit area, which is not shown in FIG. 2 to FIG. 11. The access transistor as depicted in FIG. 1 is also omitted through FIG. 2 to FIG. 11.

According to one embodiment, a bottom electrode layer 122 for coupling with a MTJ element is formed in the ILD layer 120 on the substrate 10. The bottom electrode layer 122 may be electrically connected to a terminal of a transistor that is fabricated on the substrate 10 as depicted in FIG. 1. According to one embodiment, the bottom electrode layer 122 may comprise NiCr, Ru, Pt, Cu, Ta, TaN, Ti, TiN, or any combinations thereof, but not limited thereto. Another ILD layer 121 may be deposited on the bottom electrode layer 122 and the ILD layer 120. For example, the ILD layer 121 may comprise a silicon oxide layer, but not limited thereto. According to one embodiment, a via 123 may be formed in the ILD layer 121 on the bottom electrode layer 122. The via 123 is aligned and in direct contact with the bottom electrode layer 122. The via 123 may comprise NiCr, Ru, Pt, Cu, Ta, TaN, Ti, TiN, or any combinations thereof, but not limited thereto.

Subsequently, a plurality of thin films including an MTJ stack 200a may be deposited on the ILD layer 121 and the via 123. According to one embodiment, for example, the plurality of thin films may generally comprise the reference layer 210, the tunnel barrier layer 220 stacked directly on the reference layer 210, the free layer 230 stacked directly on the tunnel barrier layer 220, the capping layer 240 stacked directly on the free layer 230, and the top electrode layer 322 stacked directly on the capping layer 240. It is to be understood that the stack structure and the number of layer/sub-layers depicted through FIG. 2 to FIG. 11 are for illustration purposes only.

For example, the reference layer 210 may be formed by sequentially depositing a bottom pinned layer 211, a ruthenium metal layer 212, a top pinned layer 213, a tantalum metal layer 214, and a magnetic material layer 215 such as CoFeB, on the ILD layer 121 and the via 123. According to some embodiments, each of the bottom pinned layer 211, the top pinned layer 213, and the free layer 230 may further comprise a plurality of sub-layers. For example, the tunnel barrier layer 220 may comprise MgO, $Al_2O_3$, MgAlO, MgZnO, HfO, or any combinations thereof. For example, the free layer 230 may comprise Fe, Co, B, Ni, or any combinations thereof. For example, the free layer 230 may be formed of a magnetic material including but not limited to CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combinations thereof. The capping layer 240 may be composed of MgO, $AlO_x$, $TiO_x$, $HfO_x$, $MgAlO_x$, $MgZnO_x$, $SiO_x$, $TaO_x$, $VO_x$, or any combinations thereof. For example, the top electrode layer 322 may comprise a Ru layer and/or a Ta layer. For example, the top electrode layer 322 may be composed of Ru having hcp crystalline structure.

According to one embodiment, subsequently, a patterned sacrificial layer 500 is formed on the top electrode layer 322. To form the patterned sacrificial layer 500, for example, a material layer such as $SiO_2$, $Si_3N_4$, TiN or TaN having a thickness of about 100-300 nm is deposited on the top electrode layer 322. Thereafter, the material layer is patterned by performing conventional photolithographic processes and etching processes to define the MTJ regions. For example, the material layer may be etched by F-based or Cl-based plasma. Preferably, the patterned sacrificial layer 500 is composed of conductive material such as TiN or TaN. The thickness of patterned sacrificial layer 500 is thicker than the total thickness of the MTJ stack 200a that is comprised of at least the reference layer 210, the tunnel barrier layer 220, the free layer 230, the capping layer 240, and the top electrode layer 322.

Figure 3:
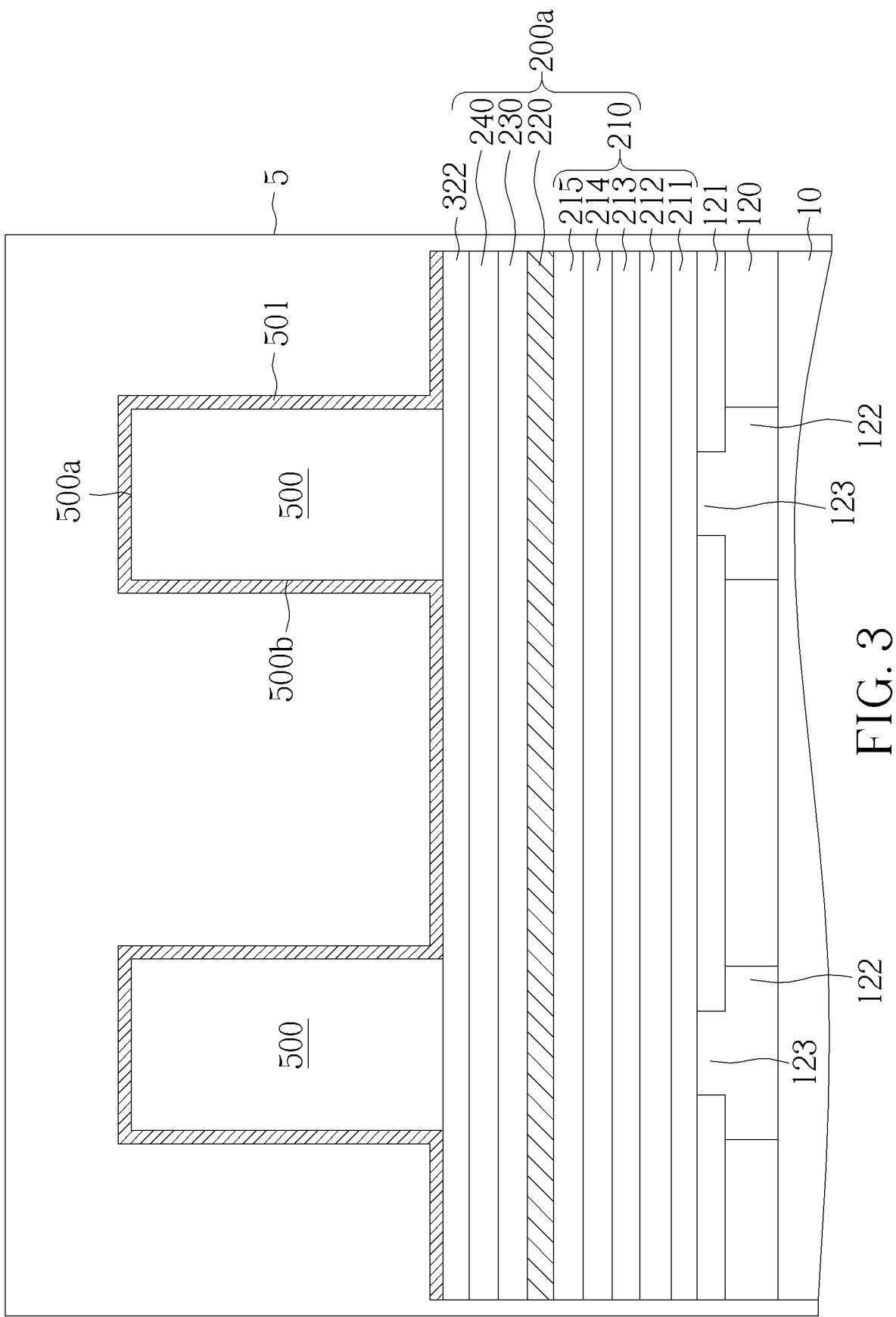

As shown in FIG. 3, optionally, a dielectric spacer layer 501 such as a silicon oxide film or a silicon nitride film may be conformally deposited onto the patterned sacrificial layer 500 and the top electrode layer 322. According to one embodiment, the deposition of the dielectric spacer layer 501 may be carried out in a high-density plasma chemical vapor deposition (HDPCVD) chamber 5 by using a deposition mode without etch (i.e. the etch mode is turned off). As known in the art, HDPCVD processes are typically employed to deposit gap-fill material on the wafers. It is to be understood that the HDPCVD tool may be a commercial CVD tool that integrates multiple reactor (vacuum) chambers and/or processing units such as cleaning units as in one single station. The wafers under processing are typically transferred between chambers by robot arms or the like. For example, the reactor chambers may be equipped with radio-frequency (RF) sources, inductive coil powered by the RF sources, a gas delivery system, a vacuum system, a temperature-controlled electrostatic chuck, and the like. The HDPCVD tools are well-known in the art, and therefore the details of the HDPCVD tool are omitted for the sake of simplicity.

According to one embodiment, the dielectric spacer layer 501 may conformally cover the top surface 500a and the sidewalls 500b of the patterned sacrificial layer 500. According to one embodiment, the dielectric spacer layer 501 may have a thickness of about 3-10 nm. Preferably, the dielectric spacer layer 501 is a silicon nitride film.

Figure 4:
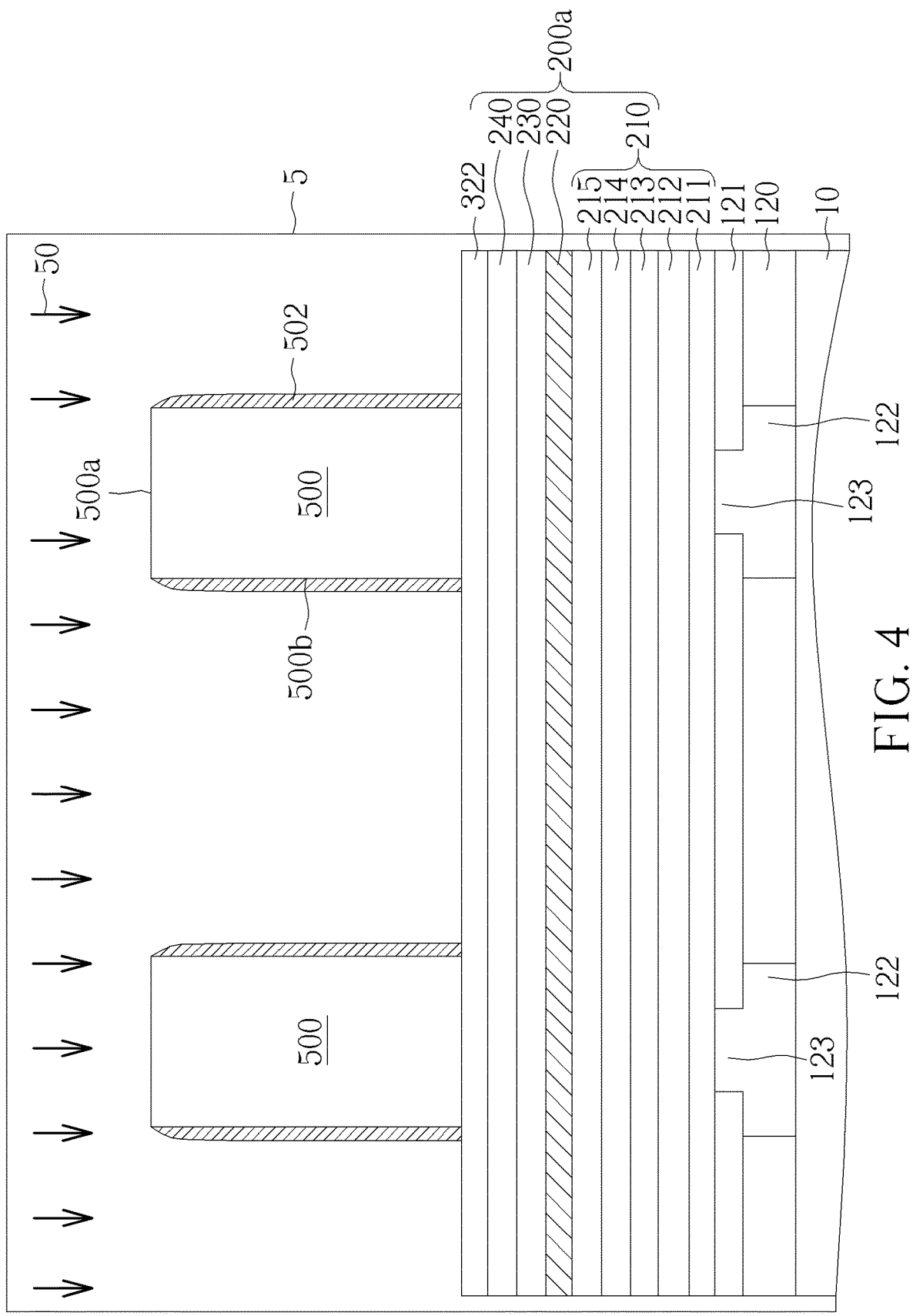

Subsequently, as shown in FIG. 4, in the same HDPCVD chamber 5, the deposition mode is turned off and the deposition process is now switched to an etch mode. An inert gas such as argon (Ar) may be introduced into the HDPCVD chamber 5 to produce Ar plasma 50, which etches the dielectric spacer layer 501 in an anisotropic manner, thereby forming sidewall spacers 502 on the sidewalls 500b of the patterned sacrificial layer 500. At this point, the top surface 500a of the patterned sacrificial layer 500 and portions of the top electrode layer 322 are revealed.

Figure 5:
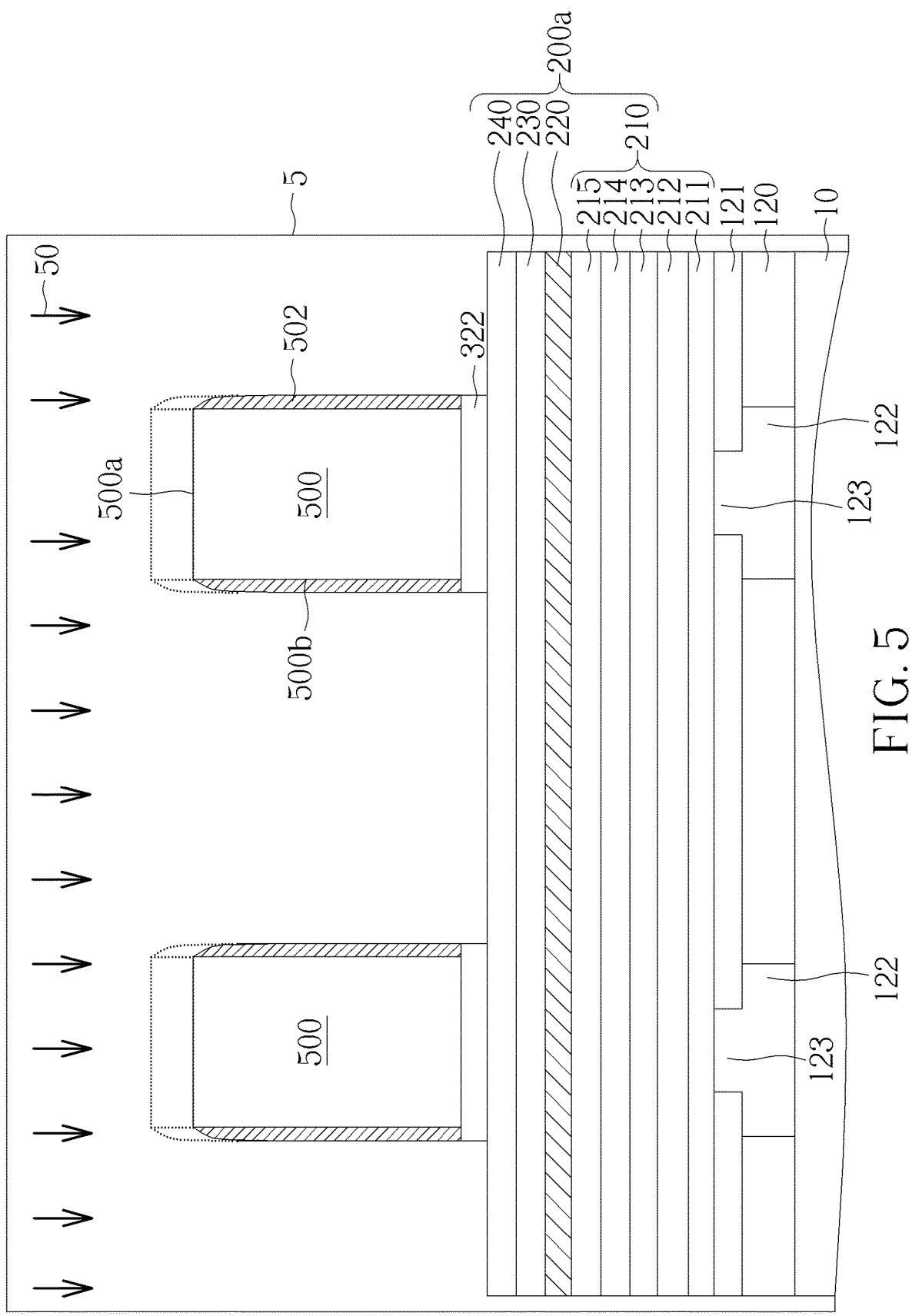

As shown in FIG. 5, in the same HDPCVD chamber 5, after forming the sidewall spacers 502 on the sidewalls 500b of the patterned sacrificial layer 500, the top electrode layer 322 not covered by the patterned sacrificial layer 500 and the sidewall spacers 502 is removed by the Ar plasma 50 generated in the HDPCVD chamber 5. The underlying capping layer 240 is revealed. A top portion of the patterned sacrificial layer 500 may be removed at the same time. The original profile of the patterned sacrificial layer 500 before the removal of the top portion of the patterned sacrificial layer 500 is indicated by dotted line. For example, the removed top portion of the patterned sacrificial layer 500 may have a thickness that is approximately equal to the thickness of the top electrode layer 322. In some embodiments, the sidewall spacers 502 may be spared.

Figure 6:
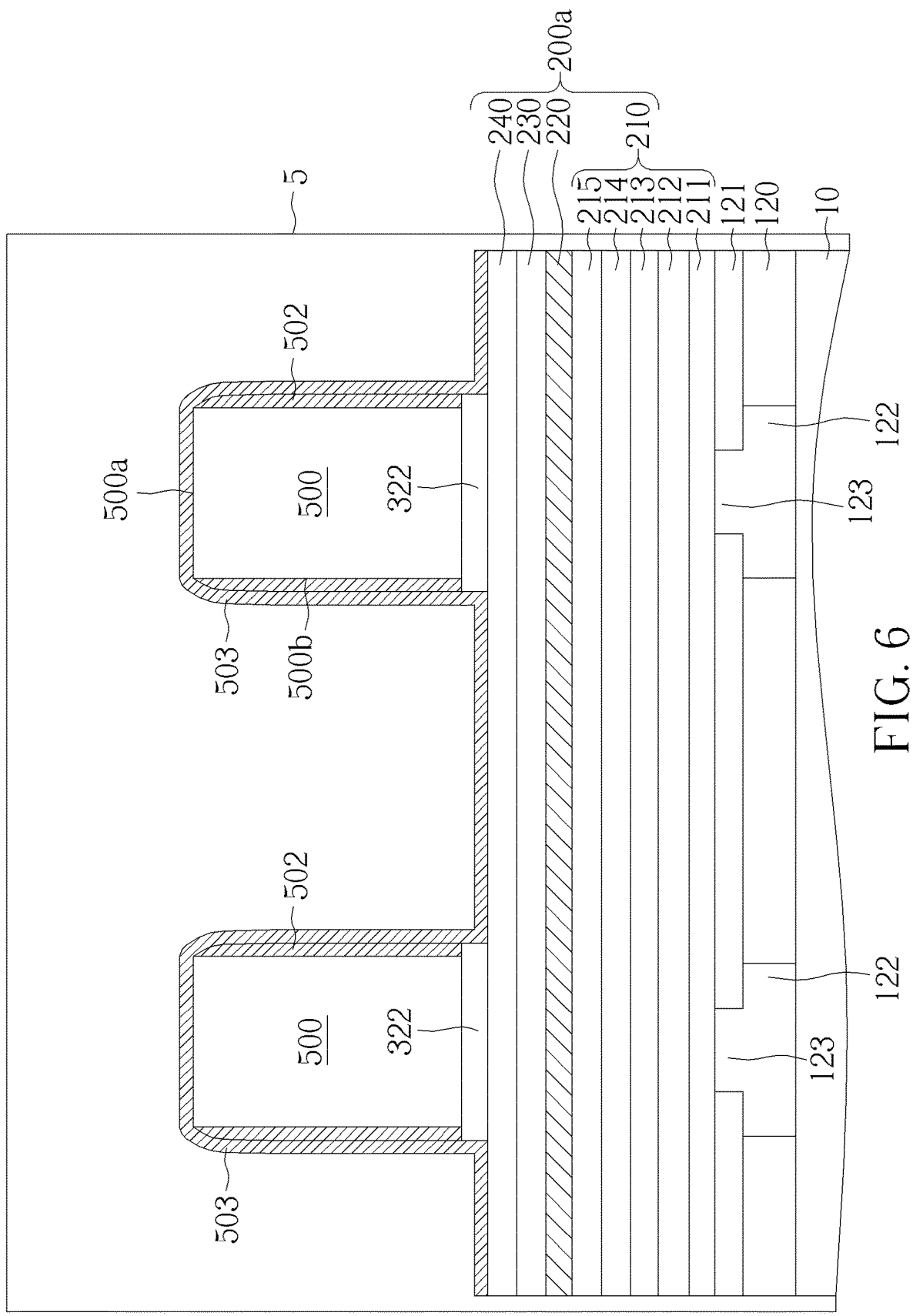
Figure 7:
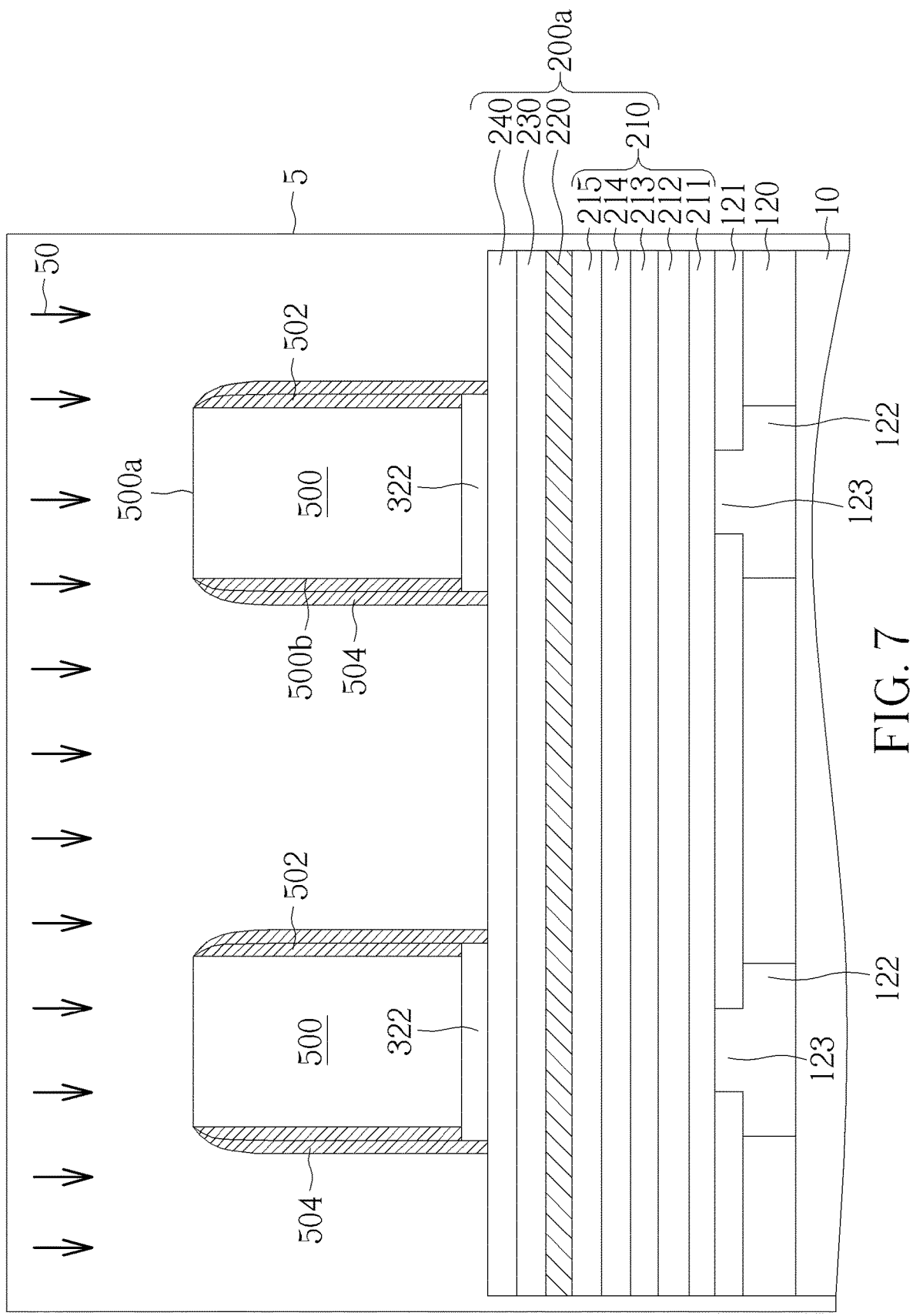
Figure 8:
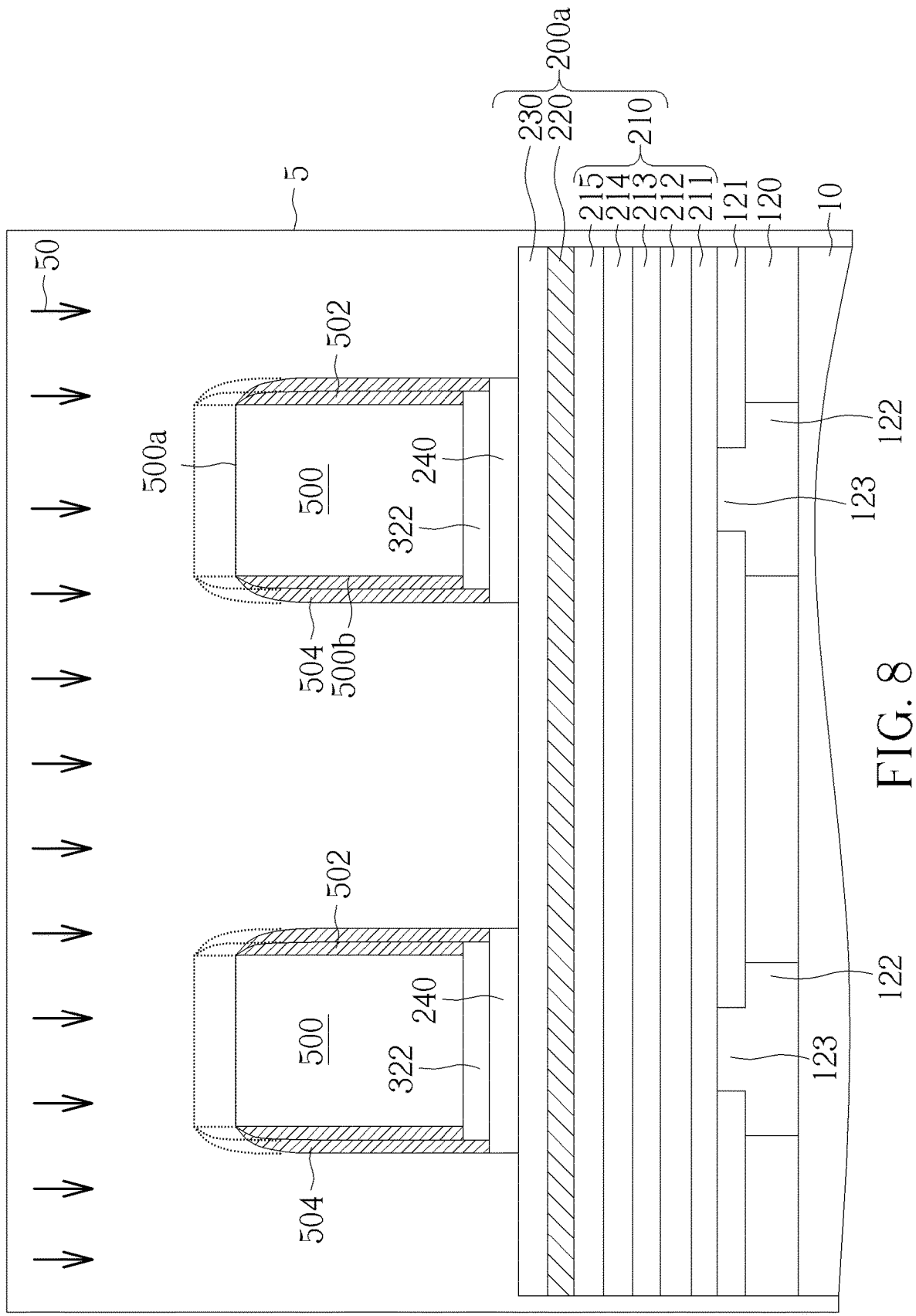

As shown in FIG. 6 to FIG. 8, after etching the top electrode layer 322, the steps in FIG. 3 to FIG. 5 are repeated in the same HDPCVD chamber 5 without breaking the vacuum. For example, in FIG. 6, a dielectric spacer layer 503 such as a silicon oxide film or a silicon nitride film may be conformally deposited onto the patterned sacrificial layer 500, the sidewall spacers 502, and onto the capping layer 240. According to one embodiment, the deposition of the dielectric spacer layer 503 may be carried out in the HDPCVD chamber 5 by using a deposition mode without etch. According to one embodiment, the dielectric spacer layer 503 may have a thickness of about 3-10 nm. Preferably, the dielectric spacer layer 503 is a silicon nitride film. Subsequently, in FIG. 7, the deposition mode is turned off and the deposition process is now switched to an etch mode. Ar plasma 50 is produced to etch the dielectric spacer layer 503 in an anisotropic manner, thereby forming sidewall spacers 504 on the sidewall spacers 502. The sidewalls of the top electrode layer 322 are covered by the sidewall spacers 504. At this point, the top surface 500a of the patterned sacrificial layer 500 and portions of the capping layer 240 are revealed.

As shown in FIG. 8, in the same HDPCVD chamber 5, after forming the sidewall spacers 504 on the sidewall spacers 502, the capping layer 240 not covered by the patterned sacrificial layer 500 and the sidewall spacers 502, 504 is removed by Ar plasma 50 in the HDPCVD chamber 5. The underlying free layer 230 is revealed. A top portion of the patterned sacrificial layer 500 may be removed at the same time.

Figure 9:
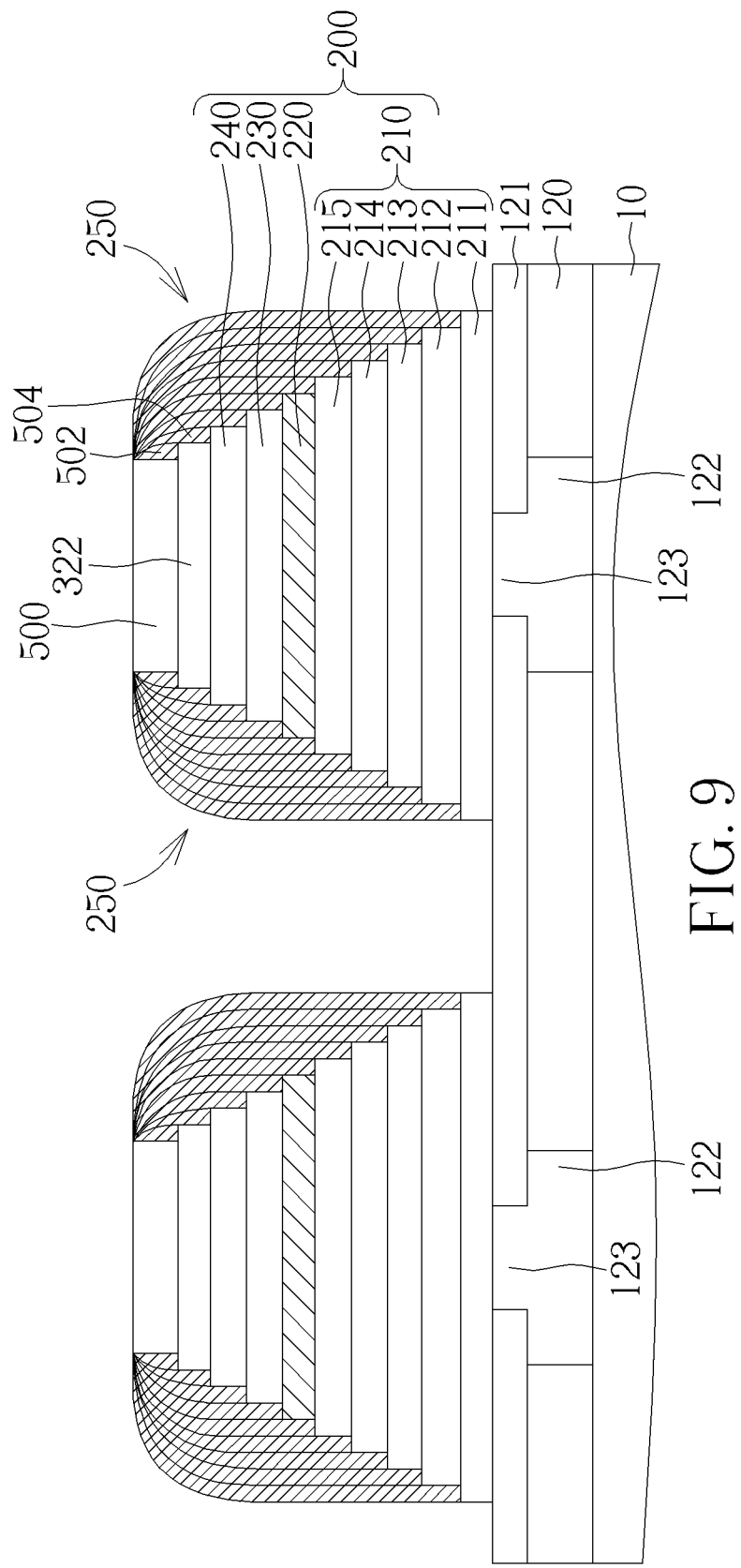

As shown in FIG. 9, the remaining layers under the capping layer 240 are etched and passivated (or protected), alternately, by repeating the steps through FIG. 6 to FIG. 8, thereby forming the MTJ elements 200 and the in-situ sidewall protection layers 250 covering the respective sidewalls of the layers/sub-layers of the MTJ elements 200. The steps described in FIG. 6 to FIG. 8 constitute one cycle. The numbers of cycles depend upon the numbers of the layer and/or sub-layers in the MTJ element 200. As previously mentioned, the deposition of the spacer layers, etching of the spacer layers, and etching of the underlying layers or sub-layers of the MTJ element or MTJ stack are carried out in the same HDPCVD chamber of a HDPCVD tool by switching between the deposition mode and the etch mode as many times as necessary until all of the layers of the MTJ stack 200a not covered by the patterned sacrificial layer 500 and the previously formed spacers are removed.

It is advantageous to use the present invention because by protecting the sidewalls of each layer or sub-layers in the MTJ stack 200a during the patterning of the MTJ element 200, the unwanted sputter residual substance may only be re-deposited onto the surfaces of the sidewall spacers, and the potential short or leakage problems may be avoided. According to some embodiments, the remaining portion of the patterned sacrificial layer 500 such as TaN directly on the top electrode layer 322 may function as a barrier layer.

Due to the nature of the manufacturing process as set forth through FIG. 2 to FIG. 9, the sidewall profile of the MTJ element 200 may comprise a ladder-shaped or a step structure. That is, the width of the lower layer may be greater than that of the adjacent upper layer in the MTJ element 200. For example, the sidewall of the bottom pinned layer 211 protrudes beyond the sidewall of the overlying ruthenium metal layer 212, and the sidewall of the ruthenium metal layer 212 protrudes beyond the sidewall of the top pinned layer 213, and so on. Further, the in-situ sidewall protection layers 250 may be composed of multiple spacers including sidewall spacer 502 and 504, which may be composed of the same material or different materials from one another.

Figure 10:
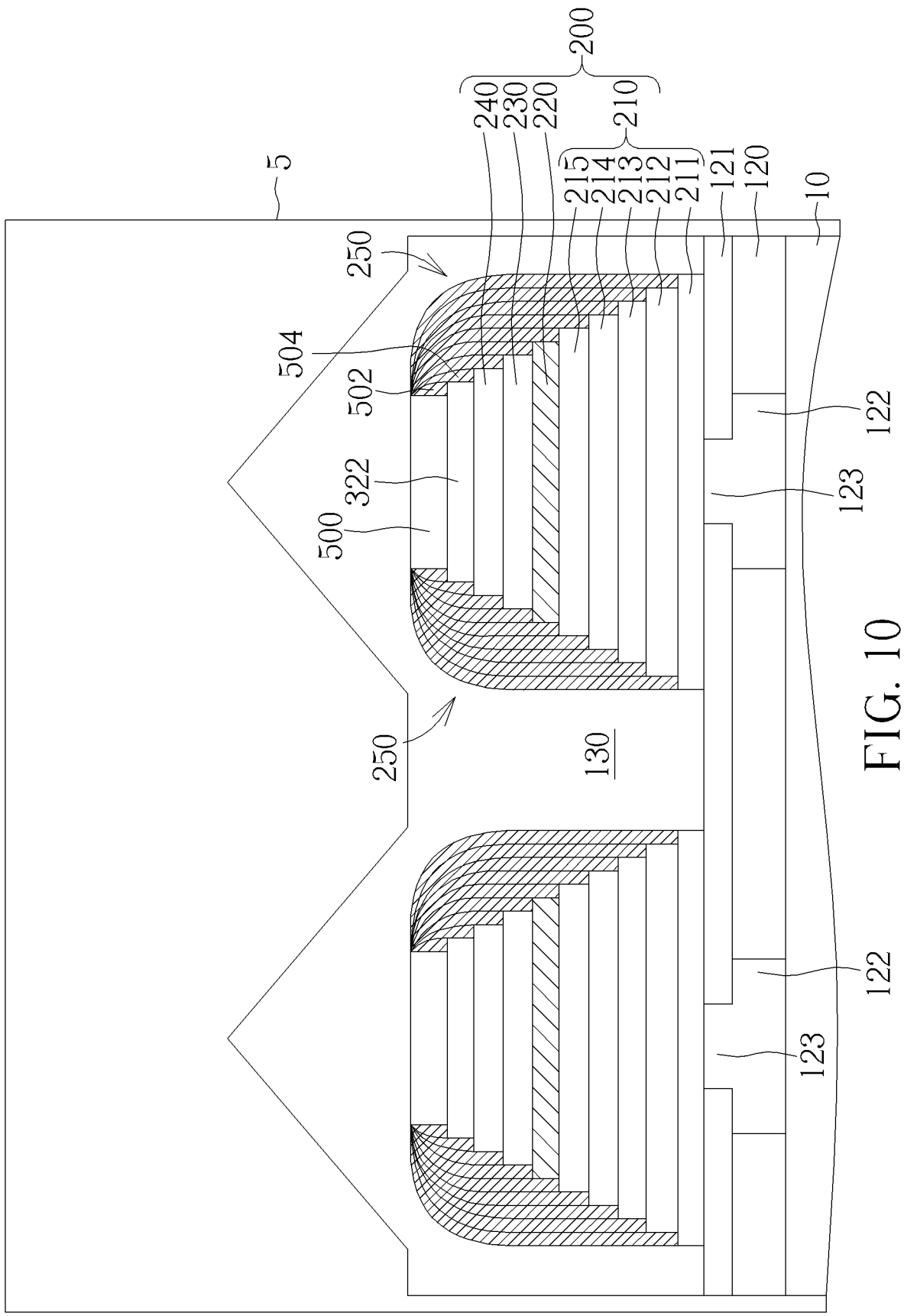

Subsequently, as shown in FIG. 10, after the formation of the MTJ element 200 and the in-situ sidewall protection layer 250 is completed, a gap-fill deposition process is carried out in the same HDPCVD chamber 5 to deposit the ILD layer 130 such as HDPCVD dielectric layer on the MTJ elements 200 and into the space between the MTJ elements 200. According to one embodiment, the aforesaid gap-fill deposition process may be carried out with a deposition-to-etch (or deposition-to-sputtering) ratio ranging between 2 and 10, but not limited thereto.

Figure 11:
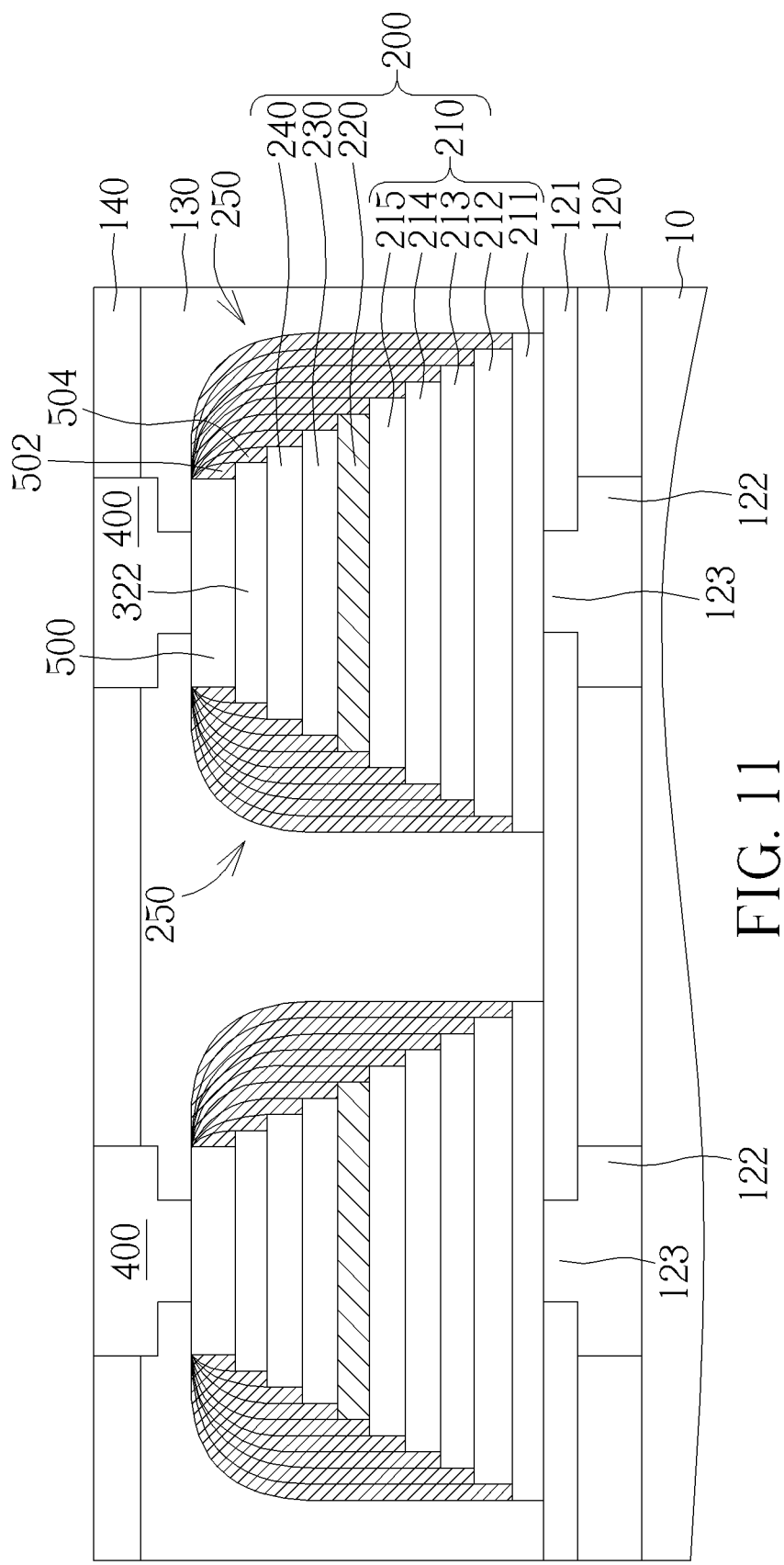

As shown in FIG. 11, a chemical mechanical polishing (CMP) process may be performed to planarize the ILD layer 130. According to one embodiment, after the CMP process, another ILD layer 140 may be deposited on the ILD layer 130. Thereafter, an interconnect structure 400 such as copper dual damascene structure may be formed in the ILD layers 130 and 140 to electrically connect the MTJ elements 200.

It is one technical feature of the present invention that the patterning of the MTJ elements 200 including the formation of the in-situ sidewall protection layers 250 composed of multiple spacers and the formation of the ILD layers 130 and 140 that fill the gap between the MTJ elements 200 are carried out in the same HDPCVD chamber without breaking the vacuum of the chamber. The formation of the MTJ stack having sidewall protection can be done in one single HDPCVD tool. Therefore, the throughput can be increased and the cost of the fabrication process is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetic memory device, comprising:
a substrate;
at least a memory stack on the substrate, said memory stack comprising a magnetic tunneling junction (MTJ) element sandwiched between a bottom electrode layer and a top electrode layer, wherein said MTJ element comprises a reference layer disposed on said bottom electrode layer, a tunnel barrier layer disposed on said reference layer, and a free layer disposed on said tunnel barrier layer, wherein said reference layer comprises a plurality of sub-layers and said free layer comprises a plurality of sub-layers, wherein said free layer protrudes from a sidewall of said top electrode layer; and
a plurality of sidewall spacers respectively covering and in direct contact with a sidewall of said top electrode layer, at least one of sidewalls of said plurality of sub-layers of said free layer, a sidewall of said tunnel barrier layer, and at least one of sidewalls of said plurality of sub-layers of said reference layer.

2. The magnetic memory device according to claim 1, wherein at least one of said plurality of sub-layers of said reference layer protrudes beyond a sidewall of said tunnel barrier layer, and wherein said tunnel barrier layer protrudes beyond a sidewall of at least one of said plurality of sub-layers of said free layer.

3. The magnetic memory device according to claim 2, wherein said at least one of said plurality of sub-layers of said reference layer has a width greater than that of said tunnel barrier layer, and wherein said tunnel barrier layer has a width greater than that of said at least one of said plurality of sub-layers of said free layer, thereby forming a ladder-shaped sidewall profile of said MTJ element.

4. The magnetic memory device according to claim 2, wherein said plurality of sidewall spacers comprises a first sidewall spacer covering said sidewall of said at least one of said plurality of sub-layers of said free layer, a second sidewall spacer covering said first sidewall spacer and said sidewall of said tunnel barrier layer, and a third sidewall spacer covering said second sidewall spacer and said at least one of sidewalls of said at least one of said plurality of sub-layers of said reference layer.

5. The magnetic memory device according to claim 4, wherein said first sidewall spacer, said second sidewall spacer, and said third sidewall spacer are silicon nitride spacers.

6. The magnetic memory device according to claim 4, wherein each of said first sidewall spacer, said second sidewall spacer, and said third sidewall space has a thickness of about 3-10 nm.

7. The magnetic memory device according to claim 1, wherein said plurality of sub-layers of said reference layer comprises a bottom pinned layer, a ruthenium metal layer, a top pinned layer, a tantalum metal layer, and a magnetic material layer.

8. The magnetic memory device according to claim 1, wherein said reference layer comprises a magnetic material comprising CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combinations thereof.

9. The magnetic memory device according to claim 1, wherein said reference layer comprises a magnetic structure comprising repeated alternating layers of two or more material.

10. The magnetic memory device according to claim 1, wherein said reference layer comprises a magnetic material comprising CoCr, CoCrB, CoCrPt, CoCrPtB, CoCrPd, CoCrTi, CoCrZr, CoCrHf, CoCrV, CoCrNb, CoCrTa, or any combinations thereof.

11. The magnetic memory device according to claim 1, wherein said reference layer comprises a super lattice structure.

12. The magnetic memory device according to claim 1, wherein said tunnel barrier layer comprises MgO, $Al_2O_3$, MgAlO, MgZnO, HfO, or any combinations thereof.

13. The magnetic memory device according to claim 1, wherein said free layer comprises Fe, Co, B, Ni, or any combinations thereof.

14. The magnetic memory device according to claim 1, wherein said free layer comprises CoFeB, CoFeBTi, CoFeBZr, CoFeBHf, CoFeBV, CoFeBTa, CoFeBCr, CoFeNi, CoFeTi, CoFeZr, CoFeHf, CoFeV, CoFeNb, CoFeTa, CoFeCr, CoFeMo, CoFeW, CoFeAl, CoFeSi, CoFeGe, CoFeP, or any combinations thereof.

15. The magnetic memory device according to claim 1, wherein said MTJ element further comprises a capping layer interposed between said top electrode layer and said free layer.

16. The magnetic memory device according to claim 15, wherein said capping layer comprises MgO or $Al_2O_3$.

17. The magnetic memory device according to claim 1, wherein said top electrode layer comprises a ruthenium (Ru) layer or a tantalum (Ta) layer.

18. The magnetic memory device according to claim 17, wherein said top electrode layer further comprises a titanium nitride (TiN) layer or a tantalum nitride (TaN) layer.

19. The magnetic memory device according to claim 1, wherein said top electrode is electrically connected to a bit line overlying said MTJ element.

20. The magnetic memory device according to claim 1, wherein said bottom electrode layer comprises NiCr, Ru, Pt, Cu, Ta, TaN, Ti, TiN, or any combinations thereof.

21. The magnetic memory device according to claim 1, wherein said bottom electrode layer is electrically coupled to a drain doping region of an access transistor disposed on said substrate.

22. The magnetic memory device according to claim 1, wherein said substrate comprises a silicon substrate or a silicon-on-insulator (SOI) substrate.

23. The magnetic memory device according to claim 1 further comprises a high-density plasma chemical vapor deposition (HDPCVD) dielectric layer covering said plurality of sidewall spacers and filling gaps in between MTJs.

* * * * *